United States Patent
Yap et al.

(10) Patent No.: US 9,029,202 B2
(45) Date of Patent: May 12, 2015

(54) METHOD OF FORMING A HIGH THERMAL CONDUCTING SEMICONDUCTOR DEVICE PACKAGE

(71) Applicant: Freescale Semiconductor, Inc., Austin, TX (US)

(72) Inventors: Weng Foong Yap, Phoenix, AZ (US); Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 14 days.

(21) Appl. No.: 13/903,308

(22) Filed: May 28, 2013

(65) Prior Publication Data
US 2014/0353816 A1 Dec. 4, 2014

(51) Int. Cl.
*H01L 21/44* (2006.01)
*H01L 21/48* (2006.01)
*H01L 21/50* (2006.01)
*H01L 23/373* (2006.01)

(52) U.S. Cl.
CPC ........ *H01L 23/3735* (2013.01); *H01L 23/3736* (2013.01)

(58) Field of Classification Search
USPC .............. 438/122, 123, 125, 112, 124, 127; 257/675, 717, 720, 712, 713, 787, 706, 257/707, 796
See application file for complete search history.

(56) References Cited

U.S. PATENT DOCUMENTS

| | | | |
|---|---|---|---|
| 5,311,060 A * | 5/1994 | Rostoker et al. | 257/796 |
| 6,146,921 A | 11/2000 | Barrow | |
| 6,838,776 B2 | 1/2005 | Leal et al. | |
| 8,217,511 B2 | 7/2012 | Tracht et al. | |
| 8,283,768 B2 | 10/2012 | Kang et al. | |
| 2008/0315396 A1 | 12/2008 | Kuhlman et al. | |
| 2009/0039485 A1 | 2/2009 | Lee | |

OTHER PUBLICATIONS

Keser et al., "The Redistributed Chip Package: A Breakthrough for Advanced Packaging", 2007 Electronic Components and Technology Conference, 2007, pp. 286-291, IEEE, US.

* cited by examiner

*Primary Examiner* — Eduardo A Rodela
*Assistant Examiner* — Dilinh Nguyen

(57) ABSTRACT

A semiconductor device package (100) includes a heat spreader (503) formed by depositing a first thin film layer (301) of a first metal on a top surface (150) of a die (110) and to exposed portions of a top surface of an encapsulant (208), depositing a second thin film layer (402) of a second metal on a top surface of the first thin film layer, and depositing a third layer (503) of a third metal on a top surface of the second thin film layer.

20 Claims, 3 Drawing Sheets

METHOD OF FORMING A HIGH THERMAL CONDUCTING SEMICONDUCTOR DEVICE PACKAGE

BACKGROUND

1. Field

This invention relates generally to semiconductor devices, and more specifically to heat spreaders in semiconductor device packages.

2. Related Art

A heat spreader is usually placed in thermal contact with a die and is used to dissipate heat from the die. A heat spreader typically has high thermal conductivity.

In known devices, a heat spreader is attached to a die with a thermally conductive adhesive material such as conductive paste. However, a maximum heat dissipation from the die by the heat spreader is limited by a thermal conductivity of the adhesive material. The thermal conductivity of typical adhesive material is about 0.5-1.5 W/mK, and the thermal conductivity of a best adhesive material readily available in the industry is about 5-10 W/mK. Adhesive material that has high thermal conductivity is expensive. A thickness of the adhesive material between a die and a heat spreader is typically at least 20μ. As the thickness of the adhesive material increases, thermal performance of a heat spreader becomes worse, due to a relatively low thermal conductivity of the adhesive material. However, dispensing a thin layer of adhesive material, e.g., 10μ or less, may cause a manufacturability issue, and may result in one or more air gaps forming between a die and a heat spreader. This is disadvantageous because the thermal conductivity of air is very low.

With ball grid array packages, known manufacturing methods may cause wire sagging during placement of a heat spreader. Known heat spreader manufacturing processes are costly.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The method in accordance with one embodiment of the disclosure replaces a thermally conductive adhesive used with known packages with at least one layer of a metal that has a significantly higher thermal conductivity than known thermally conductive adhesives so that heat dissipation is not limited by the relatively poor thermal conductivity of the thermally conductive adhesive.

A semiconductor package having a heat spreader 501 (see FIG. 5) manufactured in accordance with the disclosure provides similar or better thermal performance than known ball grid array (BGA) packages. A semiconductor package having the heat spreader 501 advantageously does not use any thermally conductive epoxy between the heat spreader and the die.

Figure 1:
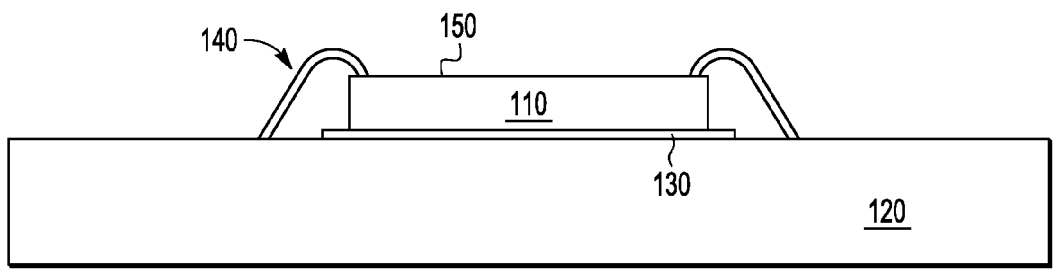
FIGS. 1-6 are cross-sectional views of a semiconductor device assembly at various stages of manufacturing, in accordance with one embodiment of the present disclosure.

For BGA and lead-frame packages, the method in accordance with one embodiment of the disclosure forms and places a heat spreader on a semiconductor device assembly, or package, 100 after molding. FIG. 1 is a cross-sectional view of the package 100 at an early stage of manufacturing, in accordance with one embodiment of the present disclosure. The package 100 includes a semiconductor die 110 (also referred to as an integrated circuit) and a package substrate 120. In one embodiment, the package 100 is a plastic BGA (PBGA) package that includes a package substrate 120 made of resin epoxy. The semiconductor die 110 (hereinafter "die") is attached to the package substrate 120 by way of a die attach adhesive 130. The package 100 includes electrical connections 140 that route electrical signals between the die 110 and the package substrate 120. In the illustrated embodiment, the electrical connections 140 are implemented as wire bonds. The die has a major top surface 150.

Figure 2:
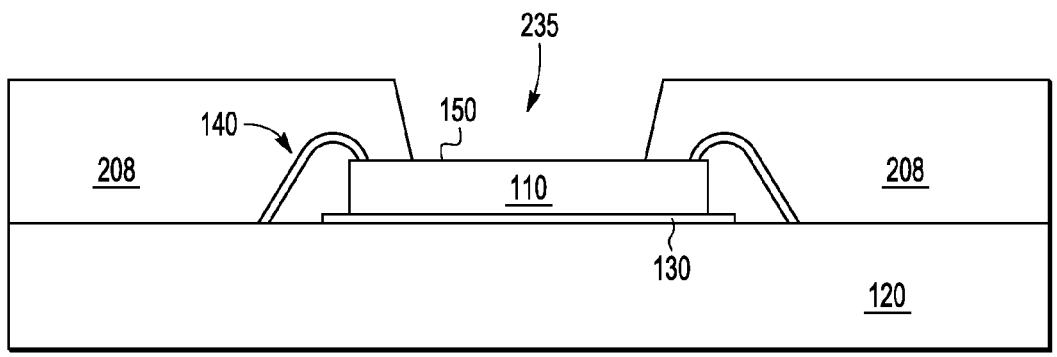

FIG. 2 is a cross-sectional view of the package 100 at a subsequent stage of manufacturing, in accordance with one embodiment of the present disclosure. A method in accordance with the disclosure includes a first step of masking a back side of the assembly that will become the package 100. Then, a second step of forming a cavity 235. In one embodiment, the cavity 235 is formed by using a mold chase. The mold chase is modified such that mold, or encapsulation, compound 208 (also referred to as encapsulant) is not applied at the non-wire bonded area. In other words, the package 100 is selectively molded so that no compound 208 is above much of the area of the top surface 150 of the die 110. The cavity 235 exposes a non-wire bond area. In one embodiment, film-assisted molding is used to form the cavity 235. With the illustrated method, there is no compound 208 at the cavity 235. With another method (not shown), there is initially compound 208 over the die 110, and then the cavity 235 is formed by selectively removing compound above a non-peripheral portion of the die.

The compound 208 surrounds a peripheral portion of the die 110. The compound 208 covers the electrical connections 140 and extends over the peripheral portion of the die 110 and over a top major surface of the package substrate 120. The compound 208 is formed so as to expose the top major surface 150 of the die 110. In one embodiment, film-assisted molding may be used to form the compound 208 into a desired shape, as illustrated in FIG. 2. Then, a mask used during the film-assisted molding is stripped.

Figure 3:
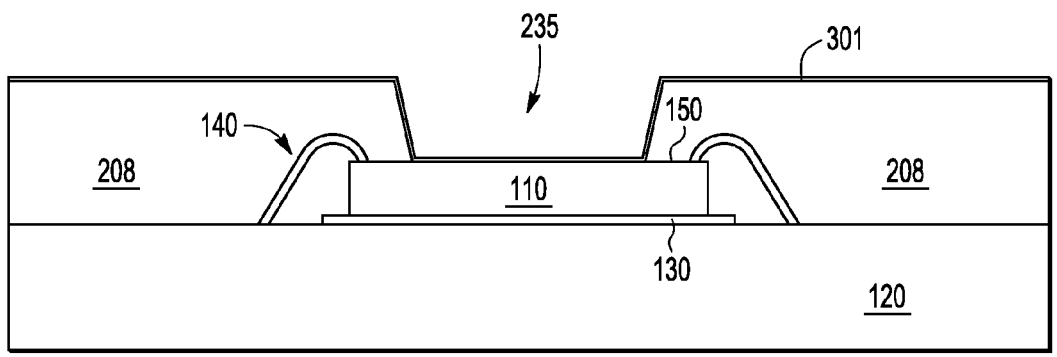

FIG. 3 is a cross-sectional view of the package 100 at a second subsequent stage of manufacturing, in accordance with one embodiment of the present disclosure. Prior to performing the method in accordance with the disclosure, the top surface 150 of the die 110 is passivated with an organic substance, such as a dielectric. In one embodiment, the top surface 150 of the die 110 is a back side of the die. Next, a first thin film layer 301 of a metal is deposited onto the top surface 150 of the die and onto exposed portions of a top major surface of the compound. The metal of the first thin film layer 301 is deposited by a chemical vapor deposition technique or by a physical vapor deposition technique. In one embodiment, the physical vapor deposition technique used is sputtering. Examples of such a metal include platinum, silver, copper, gold, aluminum, nickel, palladium, chromium, tungsten, a titanium-tungsten alloy, a copper-tungsten alloy, cadmium, boron, antimony, barium, carbon, cobalt, germanium, indium, iron, lead, lithium, magnesium, molybdenum, niobium, silicon, tantalum, zinc, tungsten carbide, tungsten disilicide, tungsten disulfide and tungsten oxide. There are other metals and alloys that are not listed above that can be used as the metal of the first thin film layer 301. A metal that has a high thermal conductivity and that adheres to a surface of an organic material such a resin of the encapsulant or to a surface of a passivation layer (not shown) on a top side of the die can be used as the metal of the first thin film layer 301. Advantageously, the metal of the first thin film layer 301 has a thermal conductivity greater than 10 W/mK. Tungsten (or an alloy that is primarily tungsten) is well suited as the metal of the first thin film layer 301 because it adheres well to organic surfaces and provides good reliability. In one embodiment, a titanium-tungsten alloy such as 10% titanium and 90% tungsten is used as such metal. Copper may not be best for the first thin film layer 301 because copper does not adhere well to organic material. A thickness of the first thin film layer 301 ranges between 100 Å and 10,000 Å. In one embodiment, the first thin film layer 301 has a thickness of 1000 Å, or 0.1μ. The first thin film layer 301 acts as a seed layer, and the first thin film layer forms a first portion of a heat spreader in accordance with one embodiment of the disclosure.

Figure 4:
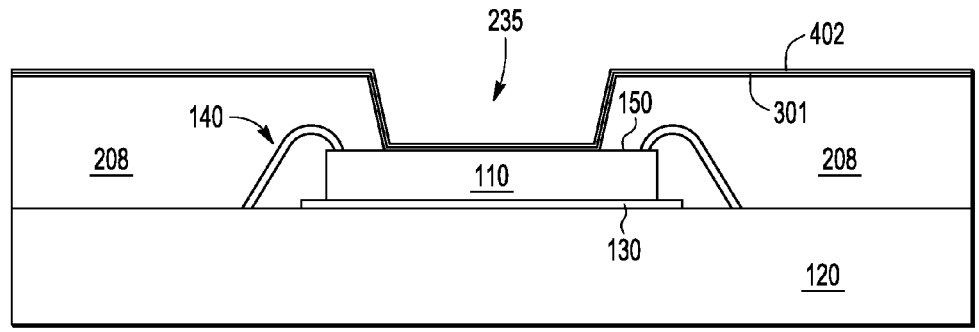

Referring now to FIG. 4. Next, a second thin film layer 402 of metal is deposited onto a top surface of the first thin film layer 301. The second thin film layer 402 of metal is deposited by a chemical vapor deposition technique or by a physical vapor deposition technique. In one embodiment, the physical vapor deposition technique used is sputtering. The second thin film layer 402 may have a thickness between 100 Å and 10,000 Å. In one embodiment, the second thin film layer 402 has a thickness of 2000 Å, or 0.2μ. A metal that has high thermal conductivity and that can bond well to the metal of the first thin film layer 301 is used as the metal of the second thin film layer 402. Although tungsten (or an alloy that is primarily tungsten) can be used as the metal of the second thin film layer 402, in one embodiment, a metal that has a higher thermal conductivity than tungsten (or the alloy that is primarily tungsten) is used. In one embodiment, the metal of the second thin film layer 402 is one of copper, gold, aluminum and silver, or alloys thereof. In one example of a package manufactured in accordance with the disclosure the metal of the second thin film layer 402 is copper. FIG. 4 is a cross-sectional view of the package 100 after a third subsequent stage of manufacturing, in accordance with one embodiment of the present disclosure. The second thin film layer 402 forms a second portion of the heat spreader in accordance with one embodiment of the disclosure.

Figure 5:
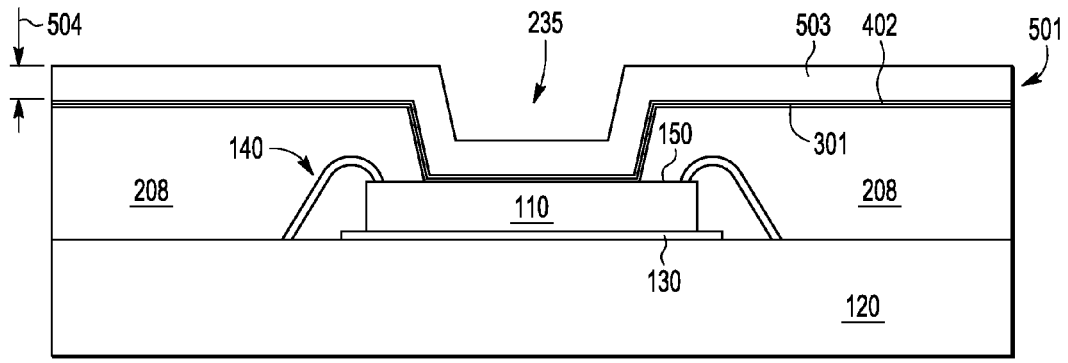

Referring now to FIG. 5. Next, a layer 503 of a metal is deposited onto a top surface of the second thin film layer 402 to a desired height, or thickness, e.g., 5-500μ. The layer 503 of a metal deposited onto the top surface of the second thin film layer 402 forms a third portion of the heat spreader in accordance with one embodiment of the disclosure. In one example of the package 100, the thickness 504 of the layer 503 of metal that is plated onto the second thin film layer 402 is 100μ. The first thin film layer 301, the second thin film layer 402 and the plated layer 503 form a heat spreader 501. In one embodiment, the layer 503 of the metal is electroplated or electroless plated (hereinafter "plated") onto the top surface of the second thin film layer 402. Examples of the metal of the plated layer 503 are copper, gold, aluminum and silver. In one embodiment, the metal of the plated layer 503 is of a same composition as the metal of the second thin film layer 402 so that the metal of the plated layer 503 makes a good bond with the metal of the second thin film layer 402. Therefore, in the one embodiment in which the second thin film layer 402 is copper, copper is plated onto the top surface of the second thin film layer. However, there are exceptions where other material could be successfully plated onto the top surface of the second thin film layer 402. For example, if the second thin film layer 402 is copper then silver, gold, aluminum or some other material could be successfully plated onto it. FIG. 5 is a cross-sectional view of the package 100 after a fourth subsequent stage of manufacturing, in accordance with one embodiment of the present disclosure.

Figure 6:
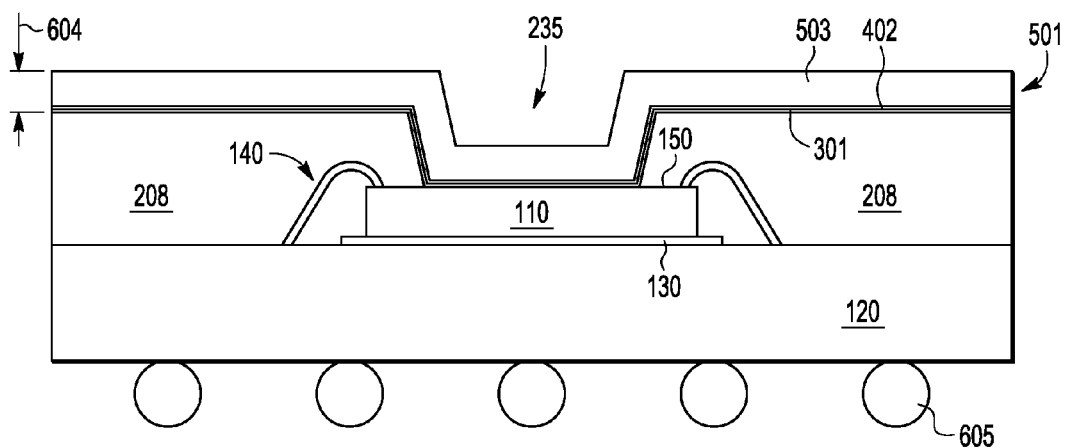

Finally, ball drop is performed. FIG. 6 is a cross-sectional view of the package 100 at a fifth subsequent stage of manufacturing, in accordance with one embodiment of the present disclosure. In the one example of the package 100 in which the thickness 504 of the plated layer 503 is 100μ, the thickness 604 of the heat spreader 501 is about 100.3μ=100μ+0.1μ+0.2μ. Other thicknesses 604 for the heat spreader 501 are foreseeable. FIG. 6 shows five solder balls 605 on a backside of the package 100 at a later stage of manufacture.

It is possible to plate copper directly to the top surface of a first thin film layer 301 of a titanium-tungsten alloy. However, sputtering a second thin film layer of copper onto the first thin film layer 301 provides a more reliable bond to the first thin film layer (compared to plating copper directly onto the first thin film layer) because sputtering uses ion or atom bombardment to make a joint with the first thin film layer. In the one example of the package 100 in which the metal of the first thin film layer 301 is different from the metal of an adjacent layer, sputtering the adjacent layer, rather than plating the adjacent layer, provides a more reliable bond to the first thin film layer.

The foregoing method and a semiconductor device package manufactured in accordance with the method are applicable to several types of semiconductor device packages, including, but not limited to, a lead-frame array package, a ball grid array (BGA) package, a plastic ball grid array (PBGA) package, a quad flat package (QFP), flat no-lead packages such as a quad flat no-lead (QFN) package and a dual flat no-lead (DFN) package, an embedded wafer-level ball grid array (eWLB) package, a chip scale package (CSP), and wafer-level packaging. Other packages are foreseeable.

Figure 7:
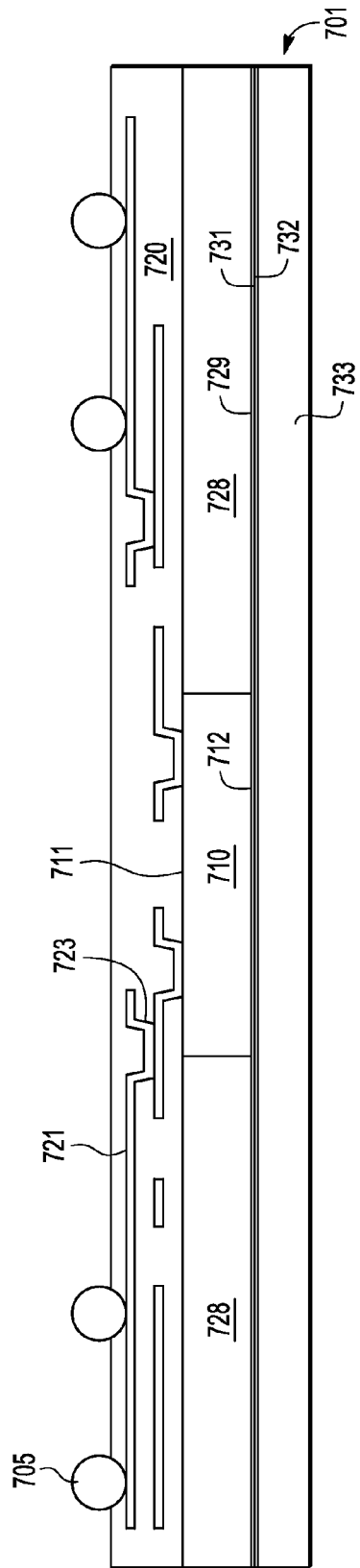
FIG. 7 is a cross-sectional view of a redistributed chip packaging panel, in accordance with another embodiment of the present disclosure.

The foregoing method and a semiconductor device package manufactured in accordance with the method are also applicable to redistributed chip packaging (RCP) panels and to fan-out wafer-level packaging. FIG. 7 is a cross-sectional view of an RCP panel 700, in accordance with another embodiment of the present disclosure. The RCP panel 700 includes a die 710 and a substrate 720. A backside 712 of the die 710 is formed by grinding, chemical mechanical planarization, or other similar technique. A front side 711 of the die 710 is coupled to the substrate 720. The substrate 720 includes copper interconnects 721 and copper vias 723. A plurality of solder balls 705 are attached to the copper interconnects 721. An encapsulant 728 surrounds a portion of the die 710 and a bottom portion of the substrate 720. The backside 712 of the die 710 is not covered by the encapsulant 728. The RCP panel 700 is flipped over after standard RCP process. Then, at least one sputtered metal deposition process onto the backside 712 of the die 710 and onto a backside 729 of the encapsulant 728 is performed. Next, at least one plating metal deposition process over the sputtered metal is performed. The at least one sputtered metal deposition process and the at least one plating deposition metal process create a heat spreader 701 on the backside of the RCP panel 700 that is in thermal contact with the die 710. For the RCP panel 700, a first thin film layer 731 is deposited directly on silicon, gallium arsenide, germanium, or other similar materials on the backside 712 of the die 710. Because there is no active connection on the back side 712 of the die 710, there is no need to passivate the back side with an organic dielectric. With one method in accordance with the disclosure, a first thin film layer 731 of a metal is sputtered onto the backside of the die 710 and the backside of the encapsulant 728. Then, a second thin film layer 732 of a metal is sputtered onto an exposed surface of the first thin film layer 731. Then, a third layer 733 of a metal is plated onto an exposed surface of the second thin film layer 732. The metals and thicknesses used for the first thin film layer 731, the second thin film layer 732 and the third layer 733 are similar to the metals and thicknesses chosen for the corresponding layers shown in FIGS. 3-5 and described hereinabove.

A package having a heat spreader in accordance with the disclosure provides similar thermal performance of a package with a known heat spreader, without using a lid spreader. Simulation results show that a package having the heat spreader in accordance with the disclosure has better thermal conductivity than a package having a known heat spreader.

The following are various embodiments of the present invention.

In one embodiment, a method is disclosed. The method comprises attaching a semiconductor die to a package substrate; forming wire bonds between the die and the package substrate; encapsulating the wire bonds with a mold compound, wherein the mold compound is configured to expose a top surface of the die; and forming a heat spreader by: depositing a first metal-containing layer over the top surface of the die and to exposed portions of a top surface of the encapsulant, depositing a second metal-containing layer over a top surface of the first metal-containing layer, and depositing a third metal-containing layer over a top surface of the second metal-containing layer.

In another embodiment, a method of assembling a semiconductor device package is disclosed. The method comprises providing an integrated circuit die assembly that includes a package substrate and an integrated circuit die mounted on a portion of a major surface of the package substrate; creating, during molding with an encapsulant, a cavity at a non-wire bonded area of the integrated circuit die assembly; and forming a heat spreader by: sputtering at least one thin film layer of a metal onto a top surface of the integrated circuit die and onto exposed portions of a major surface of the encapsulant, and plating at least one layer of another metal onto a top surface of the at least one thin film layer.

In yet another embodiment, a device is disclosed. The device comprises an RCP panel including at least one die and a package substrate; and a heat spreader thermally coupled to the RCP panel. The heat spreader includes at least one thin film layer of a metal on a backside of the at least one die and on a backside of the package substrate, and a plated layer of a metal on an exposed surface of the at least one thin film layer.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled. Moreover, the terms "front", "back", "top", "bottom", "over", "under", and the like, in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below. For example, this method may apply to a variety of different die assembly configurations. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A method, comprising:
   attaching a semiconductor die to a package substrate;
   forming wire bonds between the die and the package substrate;
   encapsulating the wire bonds with an encapsulant, wherein the encapsulant is configured to expose a top surface of the die; and
   forming a heat spreader by:
   depositing, by one of physical vapor deposition and chemical vapor deposition, a first thin film layer of a first metal over the top surface of the die and over exposed portions of a top surface of the encapsulant,
   depositing a second metal-containing layer over a top surface of the first thin film layer, and
   depositing a third metal-containing layer over a top surface of the second metal-containing layer.

2. The method of claim 1, wherein
   the second metal-containing layer is a second thin film layer of a second metal that is deposited by one of physical vapor deposition and chemical vapor deposition, and
   the third metal-containing layer is a third layer of a third metal that is deposited by one of electroplating and electroless plating.

3. The method of claim 2, wherein the first metal includes one of platinum, silver, copper, gold, aluminum, nickel, palladium, chromium, tungsten, a titanium-tungsten alloy, a copper-tungsten alloy, cadmium, boron, tungsten carbide, tungsten disilicide, tungsten disulfide and tungsten oxide.

4. The method of claim 3, wherein the first thin film layer has a thickness of 100 Å to 10,000 Å.

5. The method of claim 2, wherein the second thin film layer is deposited by sputtering.

6. The method of claim 2, wherein the second metal includes one of copper, gold, aluminum and silver.

7. The method of claim 6, wherein the second thin film layer has a thickness of 100 Å to 10,000 Å.

8. The method of claim 2, wherein the third metal includes one of copper, gold, aluminum and silver.

9. The method of claim 8, wherein the third metal-containing layer has a thickness of 5µ to 500µ.

10. The method of claim 1, wherein the step of encapsulating configures the encapsulant by forming a cavity above the die during film-assisted molding using a mold chase that is modified such that encapsulant is not applied above the top surface of the die.

11. A method, comprising:
attaching a semiconductor die to a package substrate;
forming wire bonds between the die and the package substrate;
encapsulating the wire bonds with an encapsulant, wherein the encapsulant is configured to expose a top surface of the die; and
forming a heat spreader by:
depositing, by sputtering, a first thin film layer of a first metal over the top surface of the die and over exposed portions of a top surface of the encapsulant,
depositing, by one of physical vapor deposition and chemical vapor deposition, a second thin film layer of a second metal over a top surface of the first thin film layer, and
depositing a third metal-containing layer of a third metal over a top surface of the second thin film layer.

12. The method of claim 11, wherein
the third metal-containing layer is deposited by one of electroplating and electroless plating.

13. The method of claim 11, wherein the first metal includes one of platinum, silver, copper, gold, aluminum, nickel, palladium, chromium, tungsten, a titanium-tungsten alloy, a copper-tungsten alloy, cadmium, boron, tungsten carbide, tungsten disilicide, tungsten disulfide and tungsten oxide.

14. The method of claim 13, wherein the first thin film layer has a thickness of 100 Å to 10,000 Å.

15. The method of claim 11, wherein the second metal includes one of copper, gold, aluminum and silver.

16. The method of claim 15, wherein the second thin film layer has a thickness of 100 Å to 10,000 Å.

17. The method of claim 11, wherein the third metal includes one of copper, gold, aluminum and silver.

18. The method of claim 17, wherein the third metal-containing layer has a thickness of 5µ to 500µ.

19. A method, comprising:
attaching a semiconductor die to a package substrate;
forming wire bonds between the die and the package substrate;
encapsulating the wire bonds with an encapsulant, wherein the encapsulant is configured to expose a top surface of the die; and
forming a heat spreader by:
depositing, by one of physical vapor deposition and chemical vapor deposition, a first thin film layer of a first metal over the top surface of the die and over exposed portions of a top surface of the encapsulant,
depositing, by one of physical vapor deposition and chemical vapor deposition, a second thin film layer of a second metal over a top surface of the first thin film layer, and
depositing a third metal-containing layer of a third metal over a top surface of the second thin film layer.

20. The method of claim 19, wherein
the third metal-containing layer is deposited by one of electroplating and electroless plating.

* * * * *